(12) United States Patent
Miyajima

(10) Patent No.: US 6,534,786 B2
(45) Date of Patent: Mar. 18, 2003

(54) SEMICONDUCTOR DEVICE HAVING A TEST ELEMENT, AND METHOD OF MANUFACTURING THE SAME

(75) Inventor: Takashi Miyajima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/835,560

(22) Filed: Apr. 17, 2001

(65) Prior Publication Data

US 2002/0063272 A1 May 30, 2002

(30) Foreign Application Priority Data

Nov. 28, 2000 (JP) .......................... 2000-360930

(51) Int. Cl.$^7$ ................................. H01L 29/18
(52) U.S. Cl. .................. 257/48; 438/11; 438/14; 438/15; 438/17; 438/18
(58) Field of Search .................... 257/48, 296, 298, 257/300, 306, 758; 438/11, 14, 15, 17, 18, 238, 239

(56) References Cited

U.S. PATENT DOCUMENTS

| 5,514,613 A | * | 5/1996 | Santadrea et al. | ............ 438/15 |
| 5,707,881 A | * | 1/1998 | Lum | ............................ 438/15 |
| 5,969,381 A | * | 10/1999 | Zenke | ......................... 257/308 |
| 5,986,283 A | * | 11/1999 | Bush et al. | .................... 257/48 |
| 5,986,301 A | * | 11/1999 | Fukushima et al. | ......... 257/306 |
| 5,990,507 A | * | 11/1999 | Mochizuki et al. | ......... 257/296 |
| 6,072,192 A | * | 6/2000 | Fulford, Jr. et al. | .......... 257/48 |
| 6,133,054 A | * | 10/2000 | Henson | ....................... 438/14 |
| 6,288,452 B1 | * | 9/2001 | Komuro | ..................... 257/797 |

FOREIGN PATENT DOCUMENTS

| JP | 5-102264 | 4/1993 |
| JP | 9-45875 | 2/1997 |

* cited by examiner

Primary Examiner—Steven Loke
Assistant Examiner—Quang Vu
(74) Attorney, Agent, or Firm—McDermott, Will & Emery

(57) ABSTRACT

In a TEG area, a conductive layer for a storage node is electrically connected through an impurity region positioned beneath the layer to an aluminum interconnection layer. In this manner, a test signal for checking a short circuit is given from the aluminum interconnection layer through a leading interconnection layer, the impurity region and so on to the storage node conductive layer. As a result, it is possible to obtain a semiconductor device making it possible to detect a short circuit between storage nodes stably even if the shape of the storage nodes in memory cells is made cylindrical; and a process for producing the same.

5 Claims, 11 Drawing Sheets

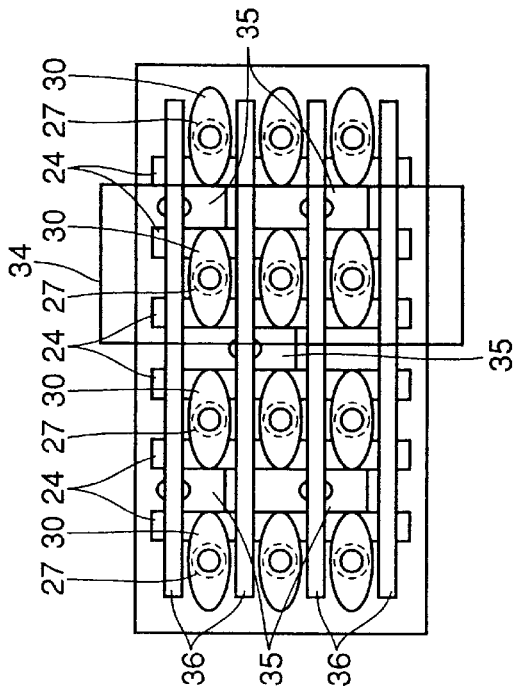
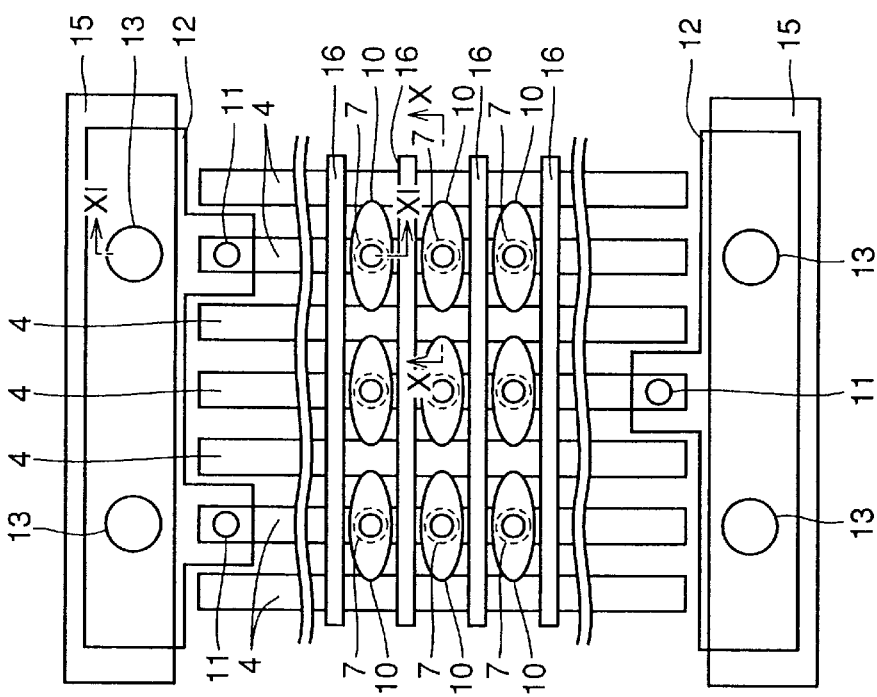
FIG.9

SEMICONDUCTOR DEVICE HAVING A TEST ELEMENT, AND METHOD OF MANUFACTURING THE SAME

BACKGROUND OF THE INVENTION

1. Field of the Invention

The present invention relates to a semiconductor device having a test element, and a method of manufacturing the same, and more specifically to a semiconductor device having a test element group (TEG) for performing a check of a short circuit between storage nodes of memory cells stably, and a method of manufacturing the same.

2. Description of the Background Art

With high integration of devices, the size of chips is made smaller and the interval between storage nodes in semiconductor memory devices also becomes narrower. In a capacitor, a storage node made of polycrystal silicon whose surface is made rough is adopted to increase the capacity thereof. In the development of a dynamic random access memory (DRAM) having a chip size, a short circuit between storage nodes, resulting from a residue of the polycrystal silicon generated between the storage nodes, causes a serious problem of device-defectiveness. It is necessary to detect the short circuit early at the stage of examination using its TEG. Thus, the structure of the TEG making it possible to detect the short circuit between the storage nodes is required.

FIG. 14 is a sectional view which schematically illustrates the structure of a semiconductor device having a conventional TEG. FIG. 15 is a schematic sectional view taken along XV—XV line of FIG. 14.

Referring to FIGS. 14 and 15, the TEG for checking a short circuit between storage nodes has a structure similar to a memory cell array area (not illustrated). In the TEG, conductive layers 104 for word lines, corresponding to the word lines, and conductive layers 116 for bit lines, corresponding to the bit lines, are arranged to cross each other. Metal insulator semiconductor (MIS) transistors T are formed near the crossing sites. The MIS transistor T has a pair of source/drain areas 122, a gate insulating film 103, and a gate electrode 104.

The pair of source/drain areas 122 are formed on the surface, of a semiconductor substrate 101, separated electrically by a trench isolation 121 and at an interval from each other. The gate electrode 104 is formed through the gate insulating film 103 on the area sandwiched by the pair of source/drain areas 122. This gate electrode 104 has a polycrystal silicon film 104a into which an impurity is introduced (a doped polysilicon film 104a), and a tungsten silicide film 104b.

A boro phospho tetra ethyl ortho silicate (BPTEOS) film 106 is formed to cover the MIS transistors T. Conductive layers 110 for storage nodes are formed on the BPTEOS film 106 to check a short circuit between the storage nodes.

The storage node conductive layers 110 are made into a thick-layer stack structure whose surface has coarse silicon crystal grains by depositing the doped polysilicon to have a thickness of 500 nm and then making the surface thereof rough. The storage node conductive layers 110 extend in one direction in parallel to the bit lines 116, and are electrically connected to the respective source/drain areas of the MIS transistors arranged along the above-mentioned direction.

A tetra ethyl ortho silicate (TEOS) interlayer dielectric 114 is formed on the storage node conductive layers 110.

Aluminum interconnection layers 115 for connecting to pads for checking a short circuit between the storage nodes are formed on the TEOS interlayer dielectric 114. The aluminum interconnection layer 115 is connected to the storage node conductive layer 110 through a contact plug 113 made of tungsten. The storage node conductive layers 110, arranged in parallel, are alternately connected to the aluminum interconnection layers 115 that are different.

The respective voltages of the storage node conductive layers 110, which are alternately arranged, are measured through the pads for checking a short circuit, which are electrically to the aluminum interconnection layers 115, so that it can be checked whether any one of the storage nodes is short-circuited or not.

In the conventional thick-layer stack capacitor structure, its storage node conductive layers are composed of a thick film. Therefore, when etching is performed to make contact holes into which the contact plugs 113 are filled, it does not happen that the contact holes penetrate through the storage node conductive layers 110.

However, in order to obtain a capacitor having a large capacity, it is necessary to change the structure of the storage nodes from the thick-film stack type to a cylinder type and make the thickness of the storage node conductive layers as thin as 50 nm. In this case, contact holes into which the contact plugs 113 are filled penetrate through the storage node conductive layers when etching is performed to make the contact holes. As a result, it is feared that a short circuit between the contact plug 113, which is filled into the contact hole, and some other conductive layer beneath the storage node conductive layer, for example, the bit line, is caused. In this case, the contact area between the storage node conductive layer and the contact plug is reduced and further the contact plug and some other conductive layer are short-circuited. It is therefore impossible to detect a short circuit between the storage nodes stably.

SUMMARY OF THE INVENTION

An object of the present invention is to provide a semiconductor device having a test element which makes it possible to detect a short circuit between storage nodes stably even if the shape of the storage nodes is made cylindrical, and a method of manufacturing the same.

The semiconductor device having a test element of the present invention is a semiconductor device having the test element for testing whether respective cylinder type electrodes in capacitors are short-circuited or not, wherein the test element includes the test conductive layer, the conductive area for leading, and a interconnection layer. The test conductive layer is produced by the same step for producing the cylinder type electrodes, and has a cylinder-shaped portion. The leading conductive area is positioned below the test conductive layer and is electrically connected to the test conductive layer. The interconnection layer is positioned above the test conductive layer, and is electrically connected to the leading conductive area to give a test signal for checking the short-circuit through the leading conductive area to the test conductive layer.

According to the semiconductor device having the test element, the interconnection layer above the test conductive layer is not directly connected to the test conductive layer but is connected through the leading conductive area below the test conductive layer to the test conductive layer. Therefore, it does not happen that contacts dropped from the interconnection layer to the test conductive layer penetrate through the test conductive layer so that a short circuit between the contacts and some other conductive layer is caused. Thus, a short circuit between storage nodes can be stably detected.

Preferably, the semiconductor device of the present invention further includes a leading interconnection layer that is positioned between the leading conductive area and the interconnection layer and is electrically connected to both of the leading conductive area and the interconnection layer. This leading interconnection layer is made of a material that is less easily etched than the test conductive layer under etching conditions for making a contact hole for connecting the leading interconnection layer and the interconnection layer.

In this manner, it is prevented that the contacts dropped from the interconnection layer to the leading interconnection layer penetrate through the leading interconnection layer so that a short circuit between the contacts and some other conductive layer is caused.

Preferably, the semiconductor device of the present invention further includes a semiconductor substrate, and the leading conductive area is a linear impurity region formed in the semiconductor substrate.

In this manner, the impurity region is used to make it possible to detect a short circuit between the storage nodes stably.

Preferably, the semiconductor device of the present invention further includes a semiconductor substrate, and the leading conductive area is a linear conductive layer formed on a surface of the semiconductor substrate.

In this manner, the conductive layer is used to make it possible to detect a short circuit between the storage nodes stably.

Preferably, in the semiconductor device of the present invention, each of the capacitors and an insulated gate type field effect transistor constitute a memory cell, and the leading conductive area is a gate conductive layer that is produced by the same step for producing a gate electrode of the insulated gate type field effect transistor.

In this manner, the gate conductive layer is used to make it possible to detect a short circuit between the storage nodes stably.

The method of the present invention is a method of manufacturing a semiconductor device including a plurality of memory cells, each of which includes a capacitor and an insulated gate type field effect transistor, and a test element for testing whether respective cylinder type electrodes of the capacitors are short-circuited or not, including the steps of forming a gate conductive layer of the test element at the same time of forming a gate electrode of the insulated gate type field effect transistor; forming an insulating layer covering the periphery of the gate conductive layer; removing an upper portion of the insulating layer to expose the gate conductive layer from the insulating layer; forming a test conductive layer of the test element to be electrically connected to a exposed portion of the gate conductive layer at the same time of forming the cylinder type electrodes of the capacitors; and forming a interconnection layer for giving a test signal for checking the short circuit through the gate conductive layer to the test conductive layer above the test conductive layer to be electrically connected to the exposed portion of the gate conductive layer.

According to the process for producing the semiconductor device having the test element, the gate conductive layer is also used as leading wiring so that the step of producing the leading wiring separately is unnecessary and the manufacturing process can be made simple.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a plan view which schematically illustrates the structure of a semiconductor device having a TEG in a fourth embodiment of the present invention;

DESCRIPTION OF THE PREFERRED EMBODIMENTS

The following will describe the embodiments of the present invention with Figs.

First Embodiment

Figure 1:
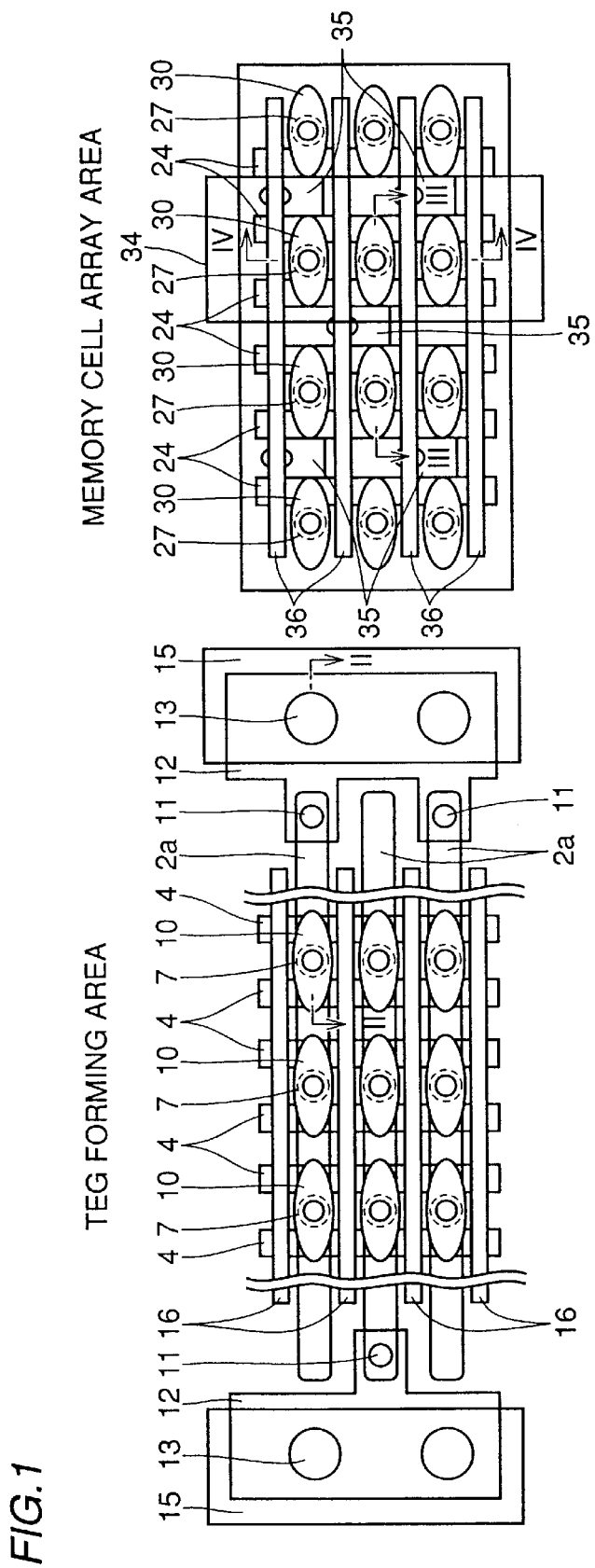
FIG. 1 is a plan view which schematically illustrates the structure of a semiconductor device having a TEG in a first embodiment of the present invention.

Referring mainly to FIG. 1, a semiconductor having a TEG includes, for example, a memory cell array area of a DRAM (the right side in FIG. 1) and a TEG forming area (the left side therein). This TEG is a member for checking a short circuit between storage nodes in the memory cells.

In the memory cell array area, word lines 24 extend in parallel to a line direction. Bit lines 36 extend in parallel to a row direction. Memory cells are arranged and formed near crossing sites of the word lines 24 and the bit lines 36.

Figure 3:
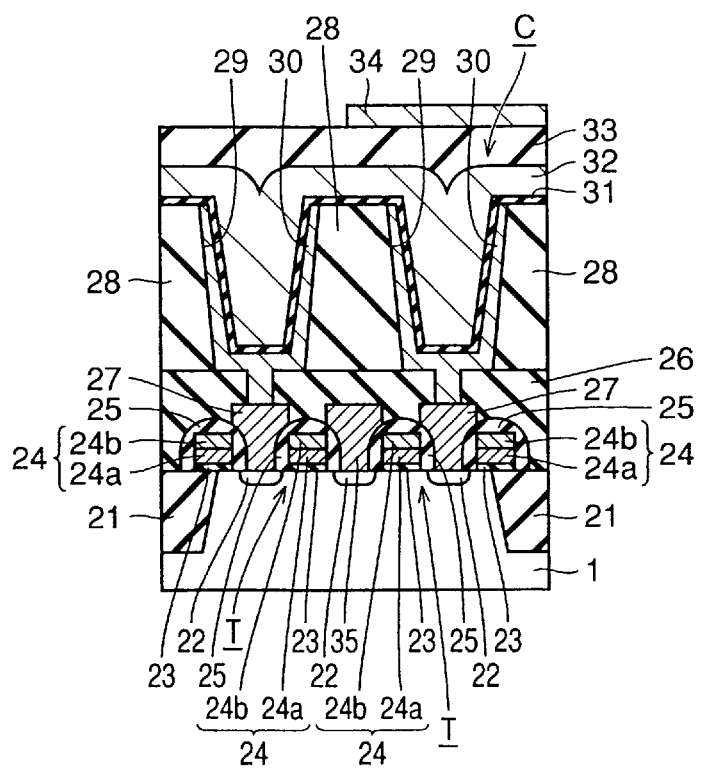
FIG. 3 is a schematic sectional view taken along III—III line of FIG. 1.
Figure 4:
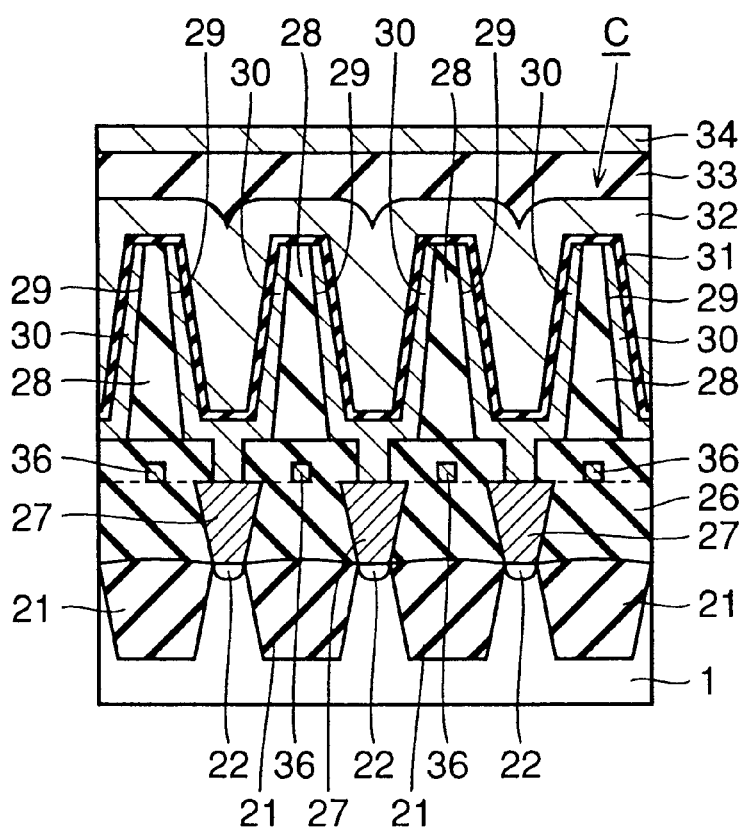
FIG. 4 is a schematic sectional view taken along IV—IV line of FIG. 1.

Referring mainly to FIGS. 3 and 4, the memory cell has a MIS transistor T and a capacitor C. The MIS transistor T has a pair of source/drain areas 22, a gate insulating film 23 and a gate electrode (word line) 24. The pair of source/drain areas 22 are formed on the surface, of a semiconductor substrate 1, separated electrically by a trench isolation 21 and at an interval from each other. The gate electrode 24 is formed through the gate insulating film 23 on the area sandwiched by the pair of source/drain areas 22. This gate electrode 24 has a lamination structure composed of a doped polysilicon film 24a and a tungsten silicide film 24b. The silicon insulating film 23 is made of, for example, a silicon oxide film.

An insulating film 25 is formed to cover the periphery of the gate electrode 24. A bit line 36 is electrically connected through a plug conductive layer 35 to one of the pair of source/drain areas 22. A capacitor C is electrically connected through a plug conductive layer 27 to the other.

The capacitor C is formed on a BPTEOS interlayer dielectric 26, and has a storage node 30, a capacitor dielectric film 31, and a cell plate 32. The storage node 30 is connected through a contact hole made in the BPTEOS interlayer dielectric 26 to the plug conductive layer 27. This storage node 30 has a cylindrical portion along the internal circumference of a groove 29 made in the BPTEOS film 28, and is subjected to treatment for making its surface rough. The cell plate 32 is formed in the manner that its parts are opposite to each other through the storage node 30 and the capacitor dielectric film 31.

A TEOS interlayer dielectric 33 is formed on the capacitor C. An aluminum wiring 34 is formed on the TEOS interlayer dielectric 33.

Figure 2:
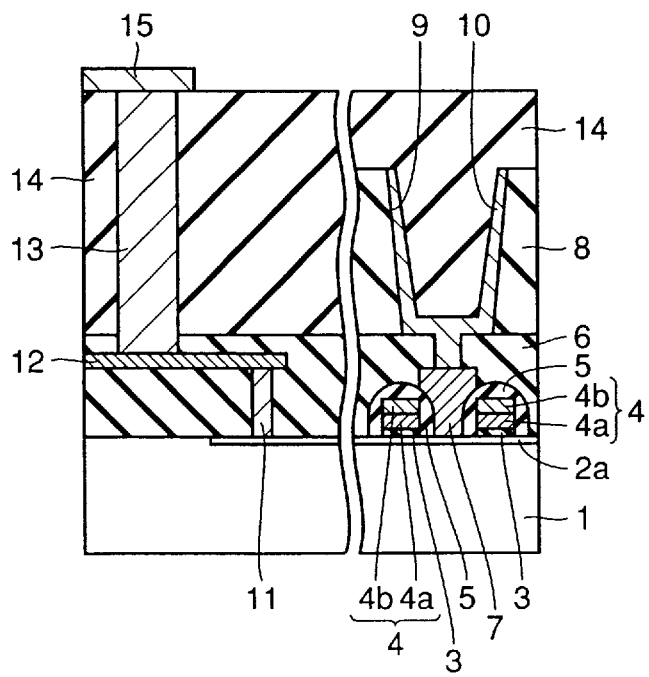
FIG. 2 is a schematic sectional view taken along II—II line of FIG. 1.

Referring mainly to FIGS. 1 and 2, the TEG forming area is formed, for example, in a dicing line area of the wafer, and has a structure similar to the above-mentioned memory cell array area.

In the TEG area, conductive layers 16 for word lines, corresponding to the word lines 24, extend in parallel to a line direction. Conductive layers 4 for bit lines, corresponding to the bit lines 36, extend in parallel to a row direction. The word line conductive layers 16 are formed by the same process for producing the word lines 24. The bit line conductive layers 4 are formed by the same method for producing the bit lines 36. The word line conductive layers 4 and the bit line conductive layers 16 are arranged to cross at right angles.

Impurity regions 2a of a single conduction type, which are linearly led out form in the same direction as the bit line conductive layers 16, are formed on the main surface of the semiconductor substrate 1. To the impurity region 2a are connected plug conductive layers 7 made of, for example, a doped polysilicon film. A conductive layer 10 for a storage node is connected through a contact hole made in the BPTEOS interlayer dielectric 6 to the plug conductive layer 7. The storage node conductive layer 10 is formed by the same process for producing the storage node 30, and is made of, for example, doped polysilicon. The storage node conductive layer 10 has a cylindrical portion along the inner circumference of a groove 9 made in the BPTEOS film 8, and has a surface made rough. The impurity regions 2a extend in the same direction as the bit line conductive layers 16, and are electrically connected to respective storage node conductive layers 10, which are arranged in the same direction.

Leading interconnection layers 12 made of, for example, tungsten are electrically connected through plug conductive layers 11 to the vicinities of ends of the impurity region 2a. An aluminum interconnection layer 15 is electrically connected through plug conductive layers 13 to the leading interconnection layer 12. The aluminum interconnection layer 15 is formed on a TEOS interlayer dielectric 14 that covers the storage node conductive layers 10.

The aluminum interconnection layers 15 are electrically connected to test pads for inputting or outputting a test signal for checking a short circuit between the storage nodes. In this manner, the test signal is supplied from the aluminum interconnection layers 15 to the storage node conductive layers 10 through the leading interconnection layers 12, the impurity regions 2a and so on, to check a short circuit between the storage nodes.

In the present embodiment, the aluminum interconnection layers 15 are not directly connected to the storage node conductive layers 10, as shown in FIG. 2. For this reason, it does not happen that contacts for connecting the aluminum interconnection layers 15 and the storage node conductive layers 10 penetrate through the storage node conductive layers 10 so that the contacts and some other conductive layer, which is a lower layer, are short-circuited.

The leading interconnection layers 12 to which the aluminum interconnection layers 15 are connected are made of a material that is less easily etched than the storage node conductive layers 10 made of doped polysilicon under etching conditions for forming the contact holes into which the-plug conductive layers 13 are filled, for example, tungsten. Therefore, when the etching for forming the contact holes is performed, the leading interconnection layers 12 function as an etching stopper. Thus, the contacts are prevented from penetrating through the leading interconnection layers 12.

In the above-mentioned manner, a short circuit between the storage nodes 30 can be stably detected.

Second Embodiment

As the first embodiment, the structure of the TEG has been described wherein a short circuit between the storage nodes 30 arranged in the direction of their short sides (the direction along which the word lines 24 extend) is checked, but it is possible to check a short circuit between the storage nodes 30 arranged in the direction of their long sides (the direction along which the bit lines 36 extend). The following will describe a structure for this.

Figure 5:
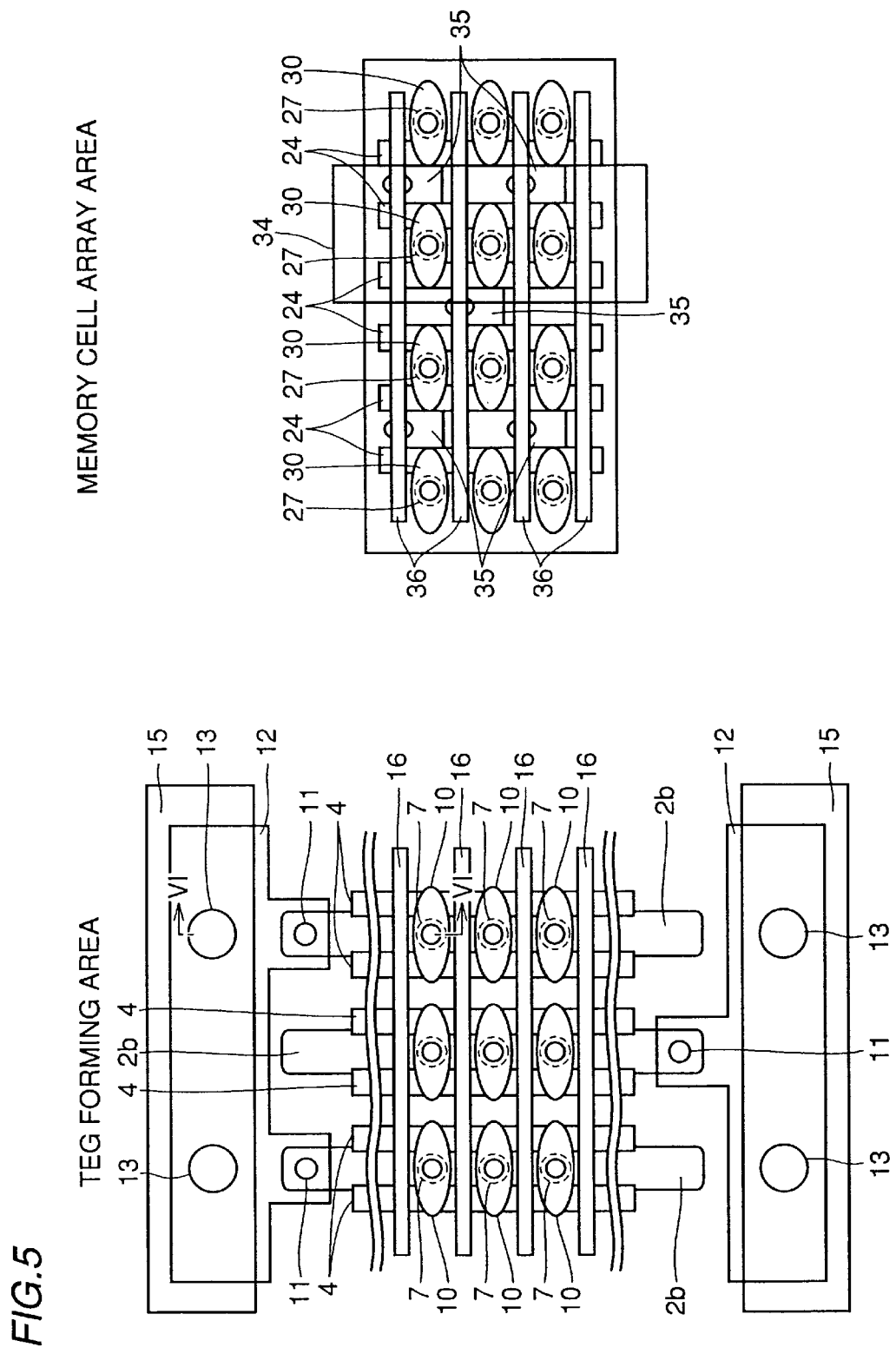
FIG. 5 is a plan view which schematically illustrates the structure of a semiconductor device having a TEG in a second embodiment of the present invention.
Figure 6:
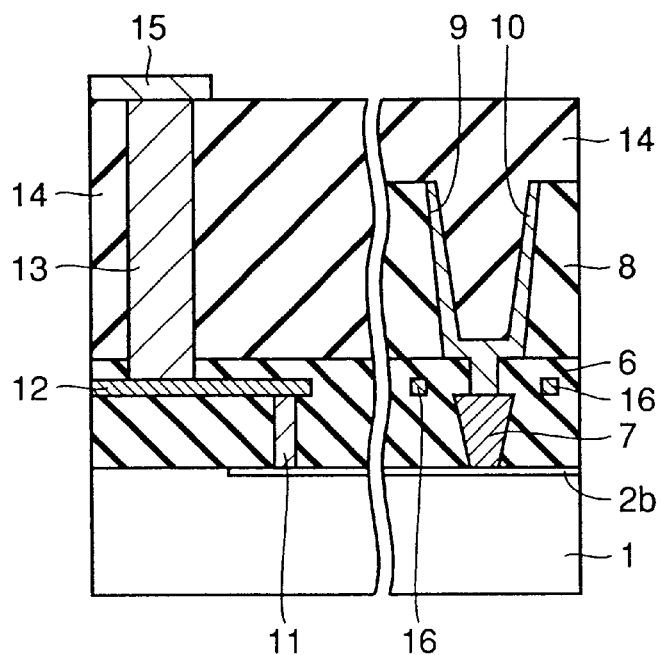
FIG. 6 is a schematic sectional view taken along VI—VI line of FIG. 5.

Referring to FIGS. 5 and 6, in the present embodiment, impurity regions 2b of a simple conduction type, which are made on a surface of a semiconductor substrate 1 in a TEG forming area, are extended in parallel to conductive layers 4 for word lines and led out. In this way, respective conductive layers 10 for storage nodes, which are arranged in the direction parallel to word lines 4, are electrically connected to the same impurity region 2b. The plural impurity regions 2b are alternately electrically connected to different aluminum interconnection layers 15.

Structures, of the TEG and a memory array area, other than the above are substantially the same as in the first embodiment. Thus, the same reference numbers are attached to the same members, and explanation thereof is omitted.

In the present embodiment, the aluminum interconnection layers 15 are electrically connected through the leading interconnection layers 12, the impurity regions 2b and so on to the storage node conductive layers 10, as shown in FIG. 6. For this reason, it is unnecessary that the aluminum interconnection layers 15 are directly connected to the storage node conductive layers 10. Thus, it does not happen that the contacts penetrate through the storage node conductive layers 10 so that a short circuit between the contacts and some other conductive layer is caused.

The leading interconnection layers 12 are made of a material that is less easily removed by etching than the storage node conductive layers 10 (for example, tungsten).

Therefore, the contacts (plug conductive layers) 13 can be prevented from penetrating the leading interconnection layers 12.

In this manner, a short circuit between the storage nodes can be stably detected.

Third Embodiment

As the second embodiment, the structure wherein the impurity regions 2b are arranged in parallel to the word line conductive layers 4 has been described. Instead of the impurity regions 2b, however, landing pads, which are linear conductive layers, may be arranged in parallel in the word line conductive layers 4. The following will describe this structure.

Figure 7:
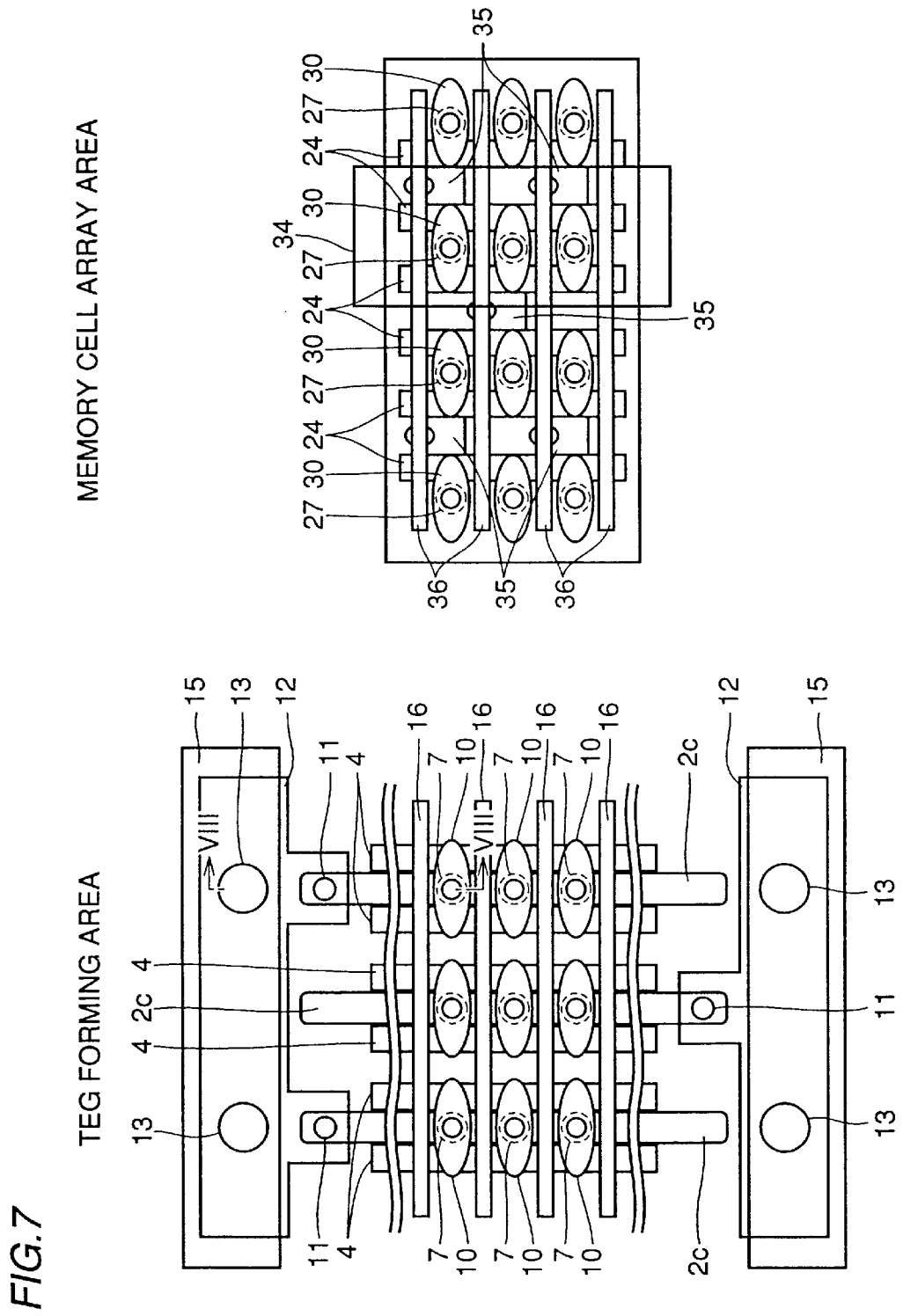
FIG. 7 is a plan view which schematically illustrates the structure of a semiconductor device having a TEG in a third embodiment of the present invention.
Figure 8:
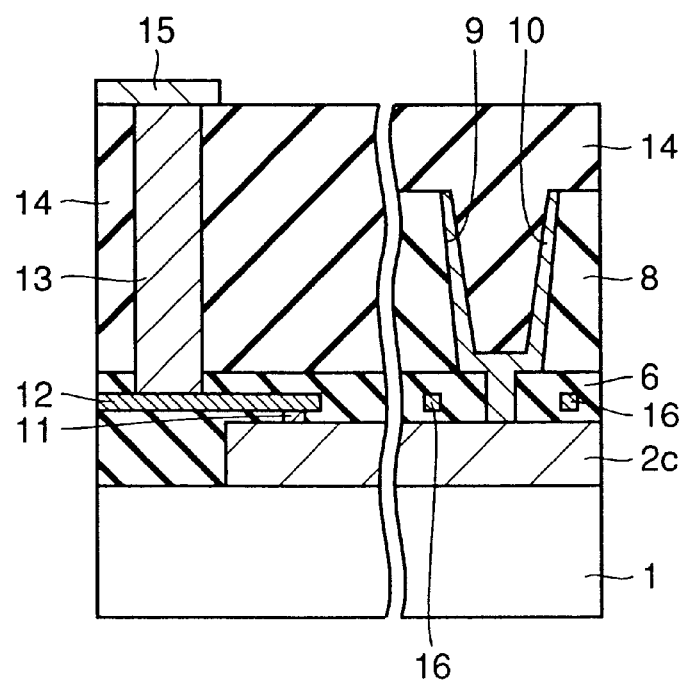
FIG. 8 is a schematic sectional view taken along VIII—VIII line of FIG. 7.

Referring to FIGS. 7 and 8, in the present embodiment, landing pads 2c, which are linear conductive layers, are extended and led out in the direction parallel to the word line conductive layers 4 inside an area sandwiched by the word line conductive layers 4. In this manner, respective conductive layers 10 for storage nodes, which are arranged in the direction along which the word line conductive layers 4 are extended, are electrically connected to the same landing pad 2c. The landing pads 2c are alternately electrically connected to different aluminum interconnection layers 15.

Structures, of the TEG and a memory cell array area, other than the above are substantially the same as in the first embodiment. Thus, the same reference numbers are attached to the same members, and explanation thereof is omitted.

The landing pads 2c are formed by the following steps.

The word line conductive layers 4 are formed, and subsequently a BPTEOS film is formed. By subjecting the BPTEOS film to photoengraving and self align contact (SAC) etching, linear concave patterns are formed. Doped polysilicon films are deposited to be embedded in the concave patterns, and subjected to etch back, so as to form the landing pads 2c made of the doped polysilicon films.

In the present embodiment, the aluminum interconnection layers 15 are not directly connected to the storage node conductive layers 10, either, and are connected through the leading interconnection layers 12, the landing pads 2c and so on to the storage node conductive layers 10. For this reason, it is unnecessary that the aluminum interconnection layers 15 are directly connected to the storage node conductive layers 10. Thus, it does not happen that the contacts penetrate through the storage node conductive layers 10 so that a short circuit between the contacts and some other conductive layer is caused.

The leading interconnection layers 12 are made of a material that is less easily removed by etching than the storage node conductive layers 10 (for example, tungsten). Therefore, the contacts plug conductive layers) 13 can be prevented from penetrating the leading interconnection layers 12.

In this manner, a short circuit between the storage nodes 30 can be stably detected.

Fourth Embodiment

As the second embodiment, the structure wherein the linear impurity regions 2b are connected to the storage node conductive layers 10 has been described. It is however allowable to use a structure wherein the storage node conductive layers 10 are connected to gate electrodes and the gate electrodes are led out. The following will describe this structure.

Figure 10:
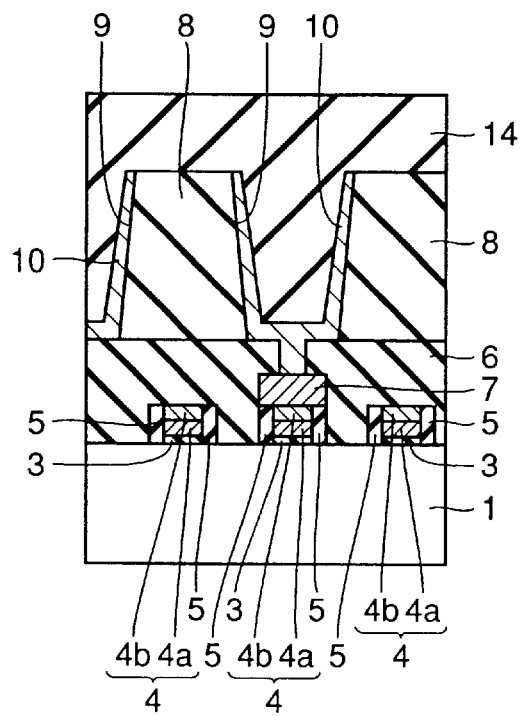
FIG. 10 is a schematic sectional view taken along X—X line of FIG. 9.
Figure 11:
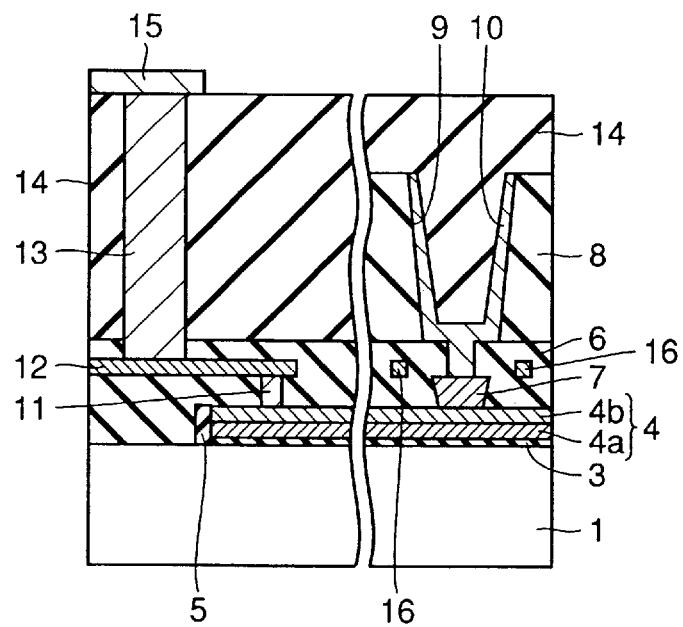
FIG. 11 is a schematic sectional view taken along XI—XI line of FIG. 9.

Referring to FIGS. 9–11, in the present embodiment, the storage node conductive layers 10 are electrically connected through plug conductive layers 7 to conductive layers 4 for word lines. In this manner, the respective storage node conductive layers 10 arranged in the direction along which the word line conductive layers 4 are extended are electrically connected to the same word line conductive layer 4. The word line conductive layers 4 are alternately electrically connected to different aluminum interconnection layers 15.

Structures, of the TEG and a memory cell array area, other than the above are substantially the same as in the first embodiment. Thus, the same reference numbers are attached to the same members, and explanation thereof is omitted.

The following will describe a production process of the present embodiment.

Figure 12:
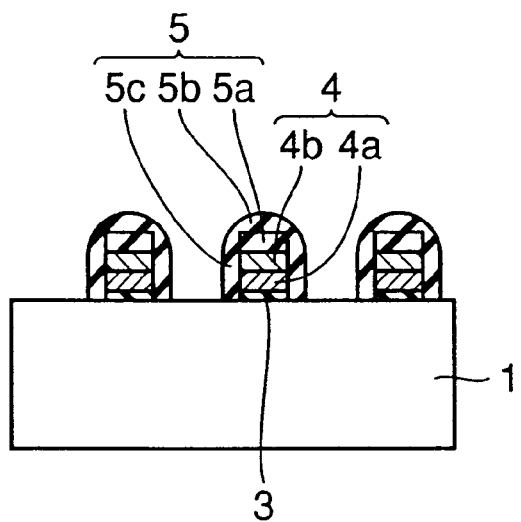
FIGS. 12 and 13 are schematic sectional views illustrating a process for producing the semiconductor device having the TEG in the fourth embodiment of the present invention in the order of steps in the process.

Referring to FIG. 12, a silicon oxide film, which will be gate insulating films 3, is formed on a surface of a semiconductor substrate 1 by thermal oxidization. A doped polysilicon film 4a, a tungsten silicide film 4b, a TEOS film 5a and a silicon nitride film 5b are, in this order, deposited on the silicon oxide film 3. Thereafter, these deposited films are subjected to ordinary photoengraving and etching so as to be patterned. Subsequently, a silicon nitride film 5c is deposited to cover the entire surface, and then the entire surface is subjected to anisotropic etching. In this way, the silicon nitride film 5c remains as a side wall spacer on the side walls of the patterned lamination films 4a, 4b, 5a and 5b.

In this state, the silicon nitride film 5b and the TEOS film 5a on the gates (word lines) 4a and 4b are removed by dry etching.

Figure 13:
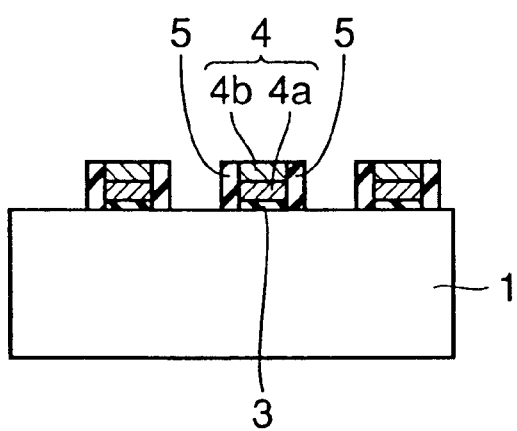
Figure 14:
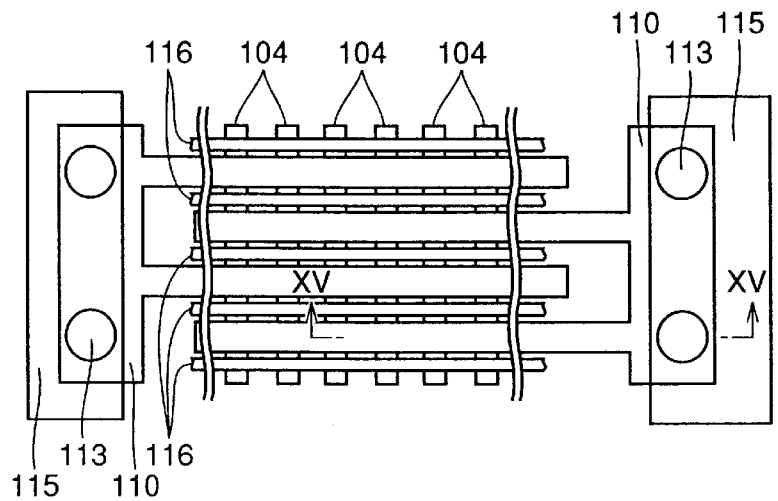
FIG. 14 is a sectional view which schematically illustrates the structure of a semiconductor device having a conventional TEG.
Figure 15:
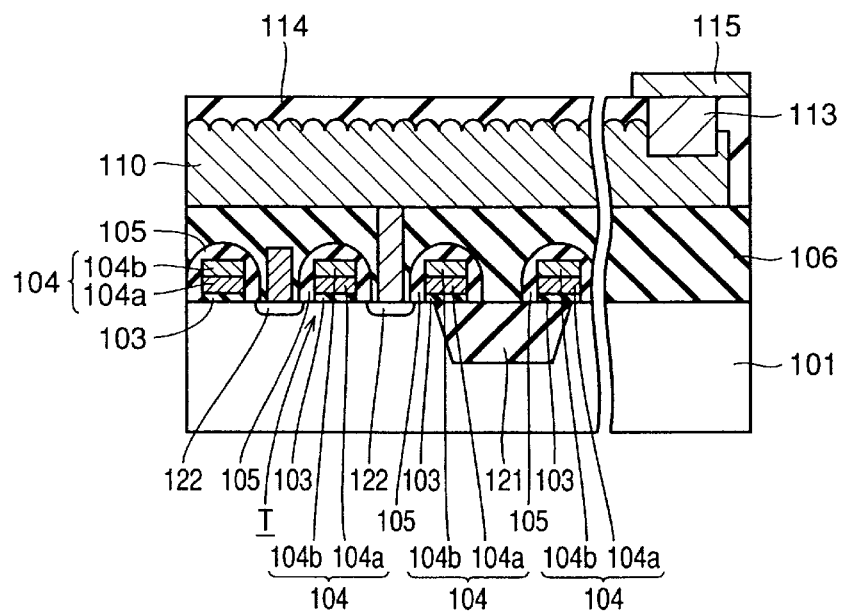
FIG. 15 is a schematic sectional view taken along XV—XV line of FIG. 14.

Referring to FIG. 13, the upper face of the tungsten silicide film 4b is exposed by the above-mentioned step. After this state, the plug conductive layers 7 and the storage node conductive layers 10 are formed, as shown in FIG. 10, so that the storage node conductive layers 10 are electrically connected to the word line conductive layers 4.

As shown in FIG. 11, in the present embodiment, the aluminum interconnection layers 15 are not directly connected to the storage node conductive layers 10, either. For this reason, it does not happen that the contacts in the aluminum interconnection layers 15 penetrate through the storage node conductive layers 10 so that a short circuit between the contacts and some other conductive layer is caused.

The leading interconnection layers 12 are made of a material that is less easily removed by etching than the storage node conductive layers 10 (for example, tungsten). Therefore, the contacts (plug conductive layers) 13 can be prevented from penetrating the leading interconnection layers 12.

In this manner, a short circuit between the storage nodes can be stably detected.

The impurity regions 2a and 2b in the first and second embodiments may be active areas whose periphery is surrounded by trench isolations.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a test element for testing whether respective cylinder type electrodes in capacitors are short-circuited or not, wherein said test element includes:
   a test conductive layer that is produced by the same step for producing said cylinder type electrodes, and has a cylinder-shaped portion,
   a leading conductive area that is positioned below said test conductive layer and is electrically connected to said test conductive layer, and
   an interconnection layer that is positioned above said test conductive layer, and is electrically connected to said leading conductive area to give a test signal to said leading conductive area through said test conductive layer.

2. The semiconductor device according to claim 1, which further includes a leading interconnection layer that is positioned between said leading conductive area and said interconnection layer and is electrically connected to both of said leading conductive area and said interconnection layer, said leading interconnection layer being made of a material that is less easily etched than said test conductive layer under etching conditions for making a contact hole for connecting said leading interconnection layer and said interconnection layer.

3. The semiconductor device according to claim 1, which further includes a semiconductor substrate, said leading conductive area being a linear impurity region formed in said semiconductor substrate.

4. The semiconductor device according to claim 1, which further includes a semiconductor substrate, said leading conductive area being a linear conductive layer formed on a surface of said semiconductor substrate.

5. The semiconductor device according to claim 1, wherein each of said capacitors and an insulated gate type field effect transistor constitute a memory cell, and said leading conductive area is a gate conductive layer that is produced by the same step for producing a gate electrode of said insulated gate type field effect transistor.

* * * * *